United States Patent
Kim et al.

(10) Patent No.: US 12,070,848 B2
(45) Date of Patent: Aug. 27, 2024

(54) ROBOT DETECTION AND CONTROL SYSTEM WITHIN CHAMBER AND SUBSTRATE PROCESSING APPARATUS INCLUDING THE SAME

(71) Applicant: SEMES Co. Ltd., Cheonan-si (KR)

(72) Inventors: Da Sol Kim, Seoul (KR); Hyeonin Kang, Cheonan-si (KR); Han Wook Jung, Hwaseong-si (KR)

(73) Assignee: SEMES Co. Ltd., Cheonan-si (KR)

( * ) Notice: Subject to any disclaimer, the term of this patent is extended or adjusted under 35 U.S.C. 154(b) by 615 days.

(21) Appl. No.: 16/911,737

(22) Filed: Jun. 25, 2020

(65) Prior Publication Data
US 2020/0406473 A1 Dec. 31, 2020

(30) Foreign Application Priority Data
Jun. 27, 2019 (KR) .......................... 10-2019-0077370

(51) Int. Cl.
*B25J 13/08* (2006.01)
*G01S 13/02* (2006.01)
*H01L 21/677* (2006.01)

(52) U.S. Cl.
CPC .......... *B25J 13/089* (2013.01); *B25J 13/086* (2013.01); *G01S 13/0209* (2013.01); *H01L 21/67742* (2013.01)

(58) Field of Classification Search
CPC . B25J 13/089; B25J 13/086; H01L 21/67742; G01S 13/0209
(Continued)

(56) References Cited

U.S. PATENT DOCUMENTS

| 11,300,963 B1 * | 4/2022 | Webster | ............... G05D 1/0223 |
| 2008/0039974 A1 * | 2/2008 | Sandin | ................. A01D 34/008 |
| | | | 901/46 |

(Continued)

FOREIGN PATENT DOCUMENTS

| KR | 10-1149800 B1 | 6/2012 |
| KR | 10-1700686 B1 | 1/2017 |

(Continued)

OTHER PUBLICATIONS

Korean Office Action dated Sep. 24, 2020, in counterpart Korean Patent Application No. 10-2019-0077370 (5 Pages in English).

(Continued)

*Primary Examiner* — Dalena Tran
(74) *Attorney, Agent, or Firm* — NSIP Law

(57) ABSTRACT

The present invention relates a robot detection and control system within a chamber capable of detecting a position of the robot within the chamber by using a plurality of UWB radars. To this end, the present invention provides a robot detection and control system within a chamber configured to include a UWB radar provided in the chamber; a position detection unit which detects a position of a robot moving in the chamber using data by the UWB radar; and a robot control unit which compares the position of the robot by the position detection unit with a position of an obstacle to control the movement of the robot. Therefore, according to the present invention, since the position of the robot within the chamber may be determined in real time, it is possible to determine whether the movement path of the robot is appropriate and prevent an emergency accident in advance.

18 Claims, 8 Drawing Sheets

(58) Field of Classification Search
USPC .......................................... 318/567; 414/805
See application file for complete search history.

(56) References Cited

U.S. PATENT DOCUMENTS

| | | | |
|---|---|---|---|
| 2010/0161124 A1* | 6/2010 | Kimura .................. | B25J 9/1666 901/14 |
| 2016/0043771 A1* | 2/2016 | Mohamadi ............... | A61B 5/05 340/8.1 |
| 2020/0206930 A1* | 7/2020 | Lee .......................... | B25J 19/06 |
| 2021/0033729 A1* | 2/2021 | Alalusi ................... | G01S 17/86 |

FOREIGN PATENT DOCUMENTS

| | | |
|---|---|---|
| KR | 10-1767924 B1 | 8/2017 |
| KR | 10-2018-0029367 | 3/2018 |
| KR | 10-2018-0058511 A | 6/2018 |
| KR | 10-2019-0037401 A | 4/2019 |

OTHER PUBLICATIONS

Korean Office Action dated Jun. 4, 2021, in counterpart Korean Patent Application No. 10-2019-0077370 (5 Pages in English).

\* cited by examiner

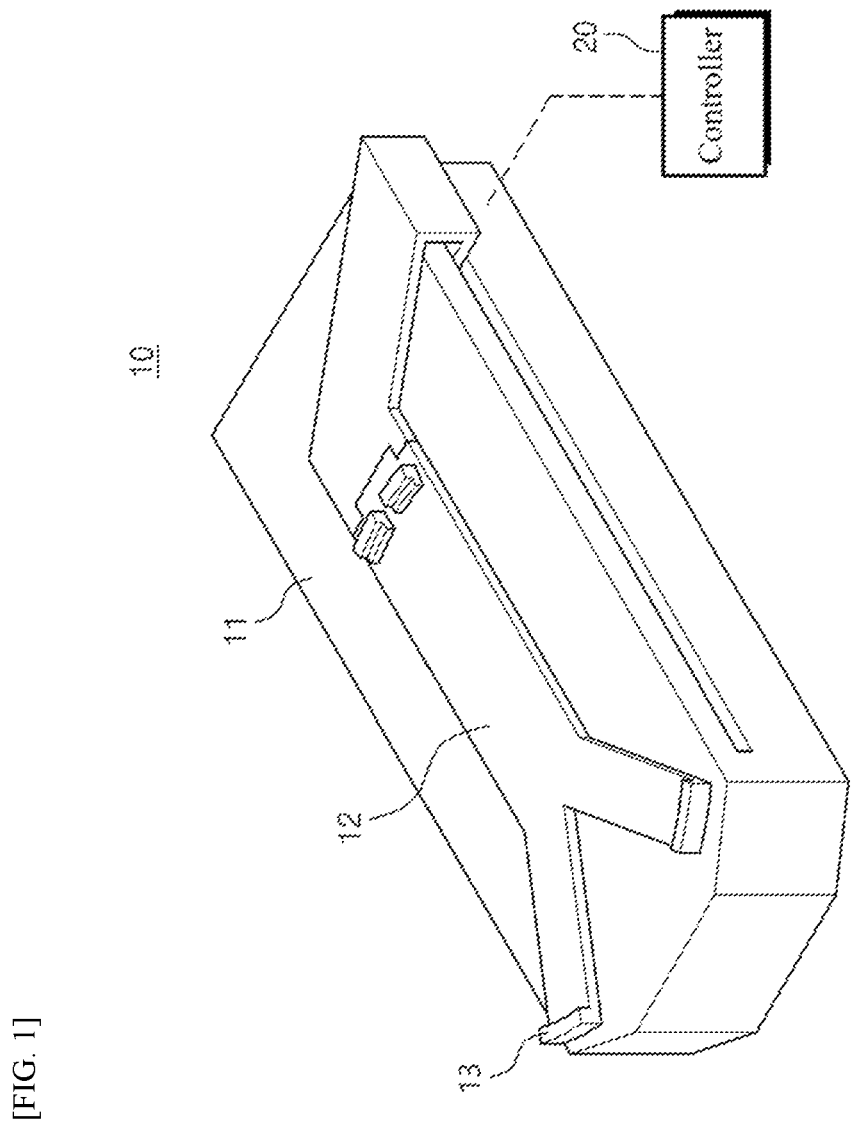
[FIG. 1]

[FIG. 2]
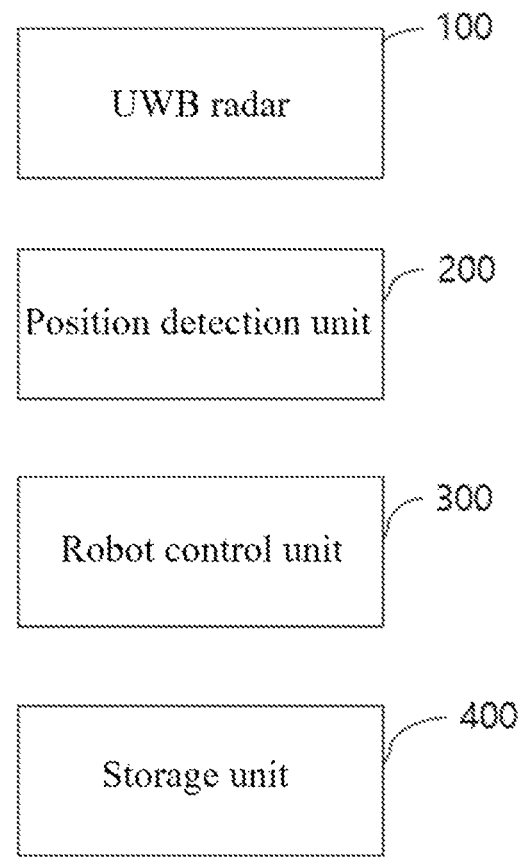

[FIG. 3]
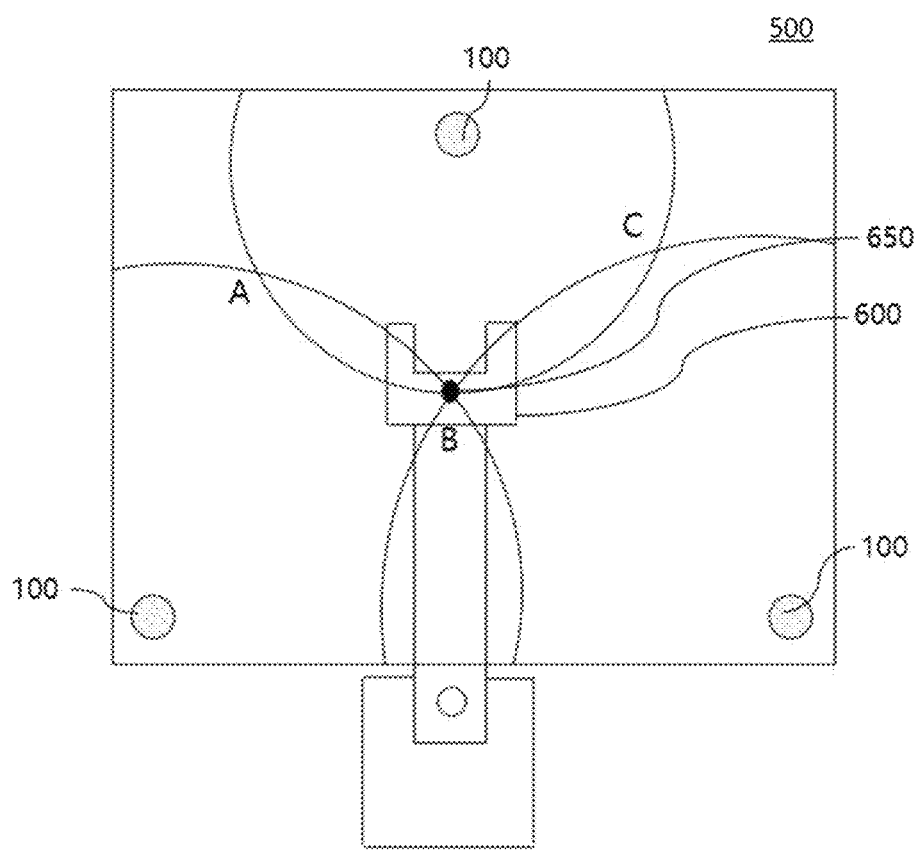

ROBOT DETECTION AND CONTROL SYSTEM WITHIN CHAMBER AND SUBSTRATE PROCESSING APPARATUS INCLUDING THE SAME

CROSS-REFERENCE TO RELATED APPLICATION

This application claims the benefit under 35 U.S.C. 119(a) of Korean Patent Application No. 10-2019-0077370 filed on Jun. 27, 2019, in the Korean Intellectual Property Office, the entire disclosure of which is incorporated herein by reference for all purposes.

TECHNICAL FIELD

The present invention relates to a robot detection and control system within a chamber and a substrate processing apparatus, and more particularly, to a robot detection and control system within a chamber and a substrate processing apparatus capable of detecting a position of the robot within the chamber by using a plurality of UWB radars.

BACKGROUND ART

A semiconductor process includes various processes such as photo, etching, thin film deposition, and cleaning. These processes are mainly performed in a process chamber, and a robot is used to transfer wafers or various parts into the chamber.

That is, the robot serves to transfer a substrate into the chamber or transfer the substrate to be processed out of the chamber.

According to Korean Patent Publication No. 10-2018-0029367 as the related art illustrated in FIG. 1, there is disclosed a transfer robot monitoring method. The transfer robot includes a support member 11, a hand 12 positioned on the support member, and a controller 20 for controlling the hand, wherein the controller is configured so that while the controller monitors the state of the hand during the driving process of the hand, when it is determined that there is an abnormality, the hand is driven again while a driving speed of the hand is reduced to re-detect the abnormality.

However, such a transfer robot monitors information such as a driving position, a speed, and torque of the hand, but a position of the transfer robot itself cannot be known.

When the robot is operated manually, the robot is operated by using coordinates such as a forward distance, a rotation angle, and a height based on the robot.

However, when the robot enters the chamber, it is impossible to determine the current position of the robot from outside, and when the robot collides with an obstacle such as a wall, it is impossible to know how the robot actually moves to cause an accident.

DISCLOSURE

Technical Problem

In order to solve the problem, specifically, an object of the present invention is to properly control a position of a robot moving within a chamber by determining the position of the robot in real time.

Further, another object of the present invention is to provide a control method of an optimized robot by accumulating data on a movement path of the robot.

Technical Solution

To achieve the objects, the present invention provides a robot detection and control system within a chamber configured to include a UWB radar provided in the chamber; a position detection unit which detects a position of a robot moving in the chamber using data by the UWB radar; and a robot control unit which compares the position of the robot by the position detection unit with a position of an obstacle to control the movement of the robot.

The robot control unit may calculate a measurement distance between a coordinate of the robot and a coordinate of the obstacle and compare the measurement distance with a safety distance.

A separate safety distance for each obstacle may be set and stored in a storage unit, and the robot control unit may extract a shortest distance obstacle from the coordinate of the robot by the position detection unit to determine whether the measurement distance between the coordinate of the robot and a coordinate of the shortest distance obstacle is greater than or equal to the detected safety distance.

Three UWB radars may be provided, and the position detection unit may form a virtual circle having a distance from the robot detected by each UWB radar as a radius and set the maximum intersection of the circle as the coordinate of the robot.

The robot may be provided with a detection dielectric having a different dielectric constant from other obstacles.

The robot control unit may calculate a measurement distance between the coordinate of the obstacle and the coordinate of the robot inside the chamber in the same repeated operation and compare the measurement distance with the measurement distance of the previous operation to compensate the movement of the robot.

The robot control unit may convert an obstacle and a non-obstacle to each other by using the storage unit in which an obstacle map is stored according to an operation content.

According to the present invention, there is provided a substrate processing apparatus including: a chamber; a robot introduced into the chamber; a ultra wide band (UWB) radar provided in the chamber; a position detection unit which detects a position of the robot moving in the chamber using data measured by the UWB radar; and a storage unit which stores a coordinate of the robot detected by the position detection unit.

The substrate processing apparatus may further include a robot control unit controlling the movement of the robot.

The storage unit may further store a coordinate of the obstacle in the chamber.

The robot control unit may calculate a measurement distance between the coordinate of the robot and the coordinate of the obstacle and compare the measurement distance with a safety distance.

The storage unit may further store the safety distance for the obstacle, and the robot control unit may extract a shortest distance obstacle from the coordinate of the robot to determine whether the measurement distance between the coordinate of the robot and a coordinate of the shortest distance obstacle is greater than or equal to the safety distance.

Three UWB radars may be provided, and the position detection unit may form a virtual circle having a distance from the robot detected by each UWB radar as a radius and set the maximum intersection of the circle as the coordinate of the robot.

The robot may include a detection dielectric having a different dielectric constant from the obstacle in the chamber.

According to the present invention, there is provided a robot detection and control method within a chamber including: measuring, by a position detection unit, a position of a robot moving in a chamber by using a UWB radar provided in the chamber; and comparing, by a robot control unit, the position of the robot with a position of an obstacle to control the movement of the robot.

The measuring of the position of the robot may perform measuring a distance from the robot by each UWB radar, wherein three UWB radars are disposed; forming, by the position detection unit, a virtual circle having the distance from the detected by each UWB radar as a radius; and setting, by the position detection unit, the maximum intersection with each circle as a coordinate of the robot.

The robot control unit may receive the coordinate of the robot from the position detection unit in real time and store the received coordinate of the robot in the storage unit, and compare the real-time coordinate of the robot with a set coordinate stored in the storage unit and generate an alarm when the real-time coordinate of the robot is out of a critical range.

Advantageous Effects

According to the present invention, since the position of the robot within the chamber may be determined in real time, it is possible to determine whether the movement path of the robot is appropriate, and prevent an emergency accident in advance.

In addition, it is possible to design an optimized movement path of the robot later by accumulating data on the movement path of the robot.

DESCRIPTION OF DRAWINGS

FIG. 1 is a block diagram illustrating a monitoring method of a transfer robot according to the related art;

FIG. 2 is a configuration diagram illustrating a configuration of a robot detection and control system within a chamber according to the present invention;

FIG. 3 is an explanatory diagram for describing a measuring method of an UWB radar within a chamber according to the present invention;

MODES OF THE INVENTION

Figure 4A:
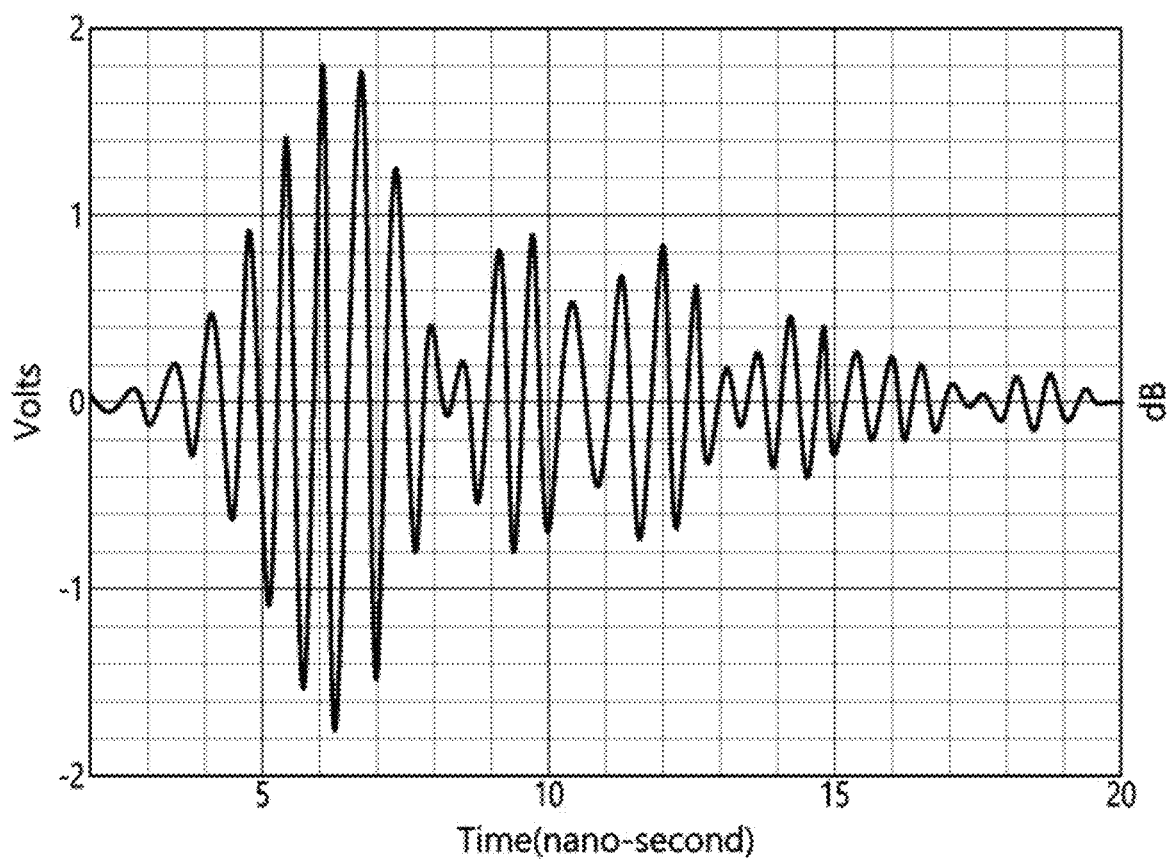
FIGS. 4A to 4D are exemplary diagrams illustrating examples of a reception waveform by the UWB radar.

Configurations and functions of embodiments of the present invention will be described in detail with reference to the accompanying drawings.

Referring to FIG. 2, a robot detection and control system within a chamber according to the present invention includes a UWB radar 100, a position detection unit 200, a robot control unit 300, and a storage unit 400. For example, the robot detection and control system may be implemented in a substrate processing apparatus including a chamber.

The UWB radar 100 is a radar using ultra wide band (UWB) wireless technology, and has advantages that frequencies are shared by using a very wide frequency of several GHz band in a baseband without using a radio carrier, and a structure of a transceiver is simple and thus the power consumption is small and the cost is reduced.

Referring to FIG. 3, in the embodiment, three UWB radars 100 are disposed inside the chamber 500. The UWB radar 100 measures a distance between the UWB radar 100 and the structure by receiving radio waves returning by radiating radio waves to a structure such as a wall or a lift pin inside the chamber. In particular, the chamber 500 may be a vacuum chamber.

Figure 4B:
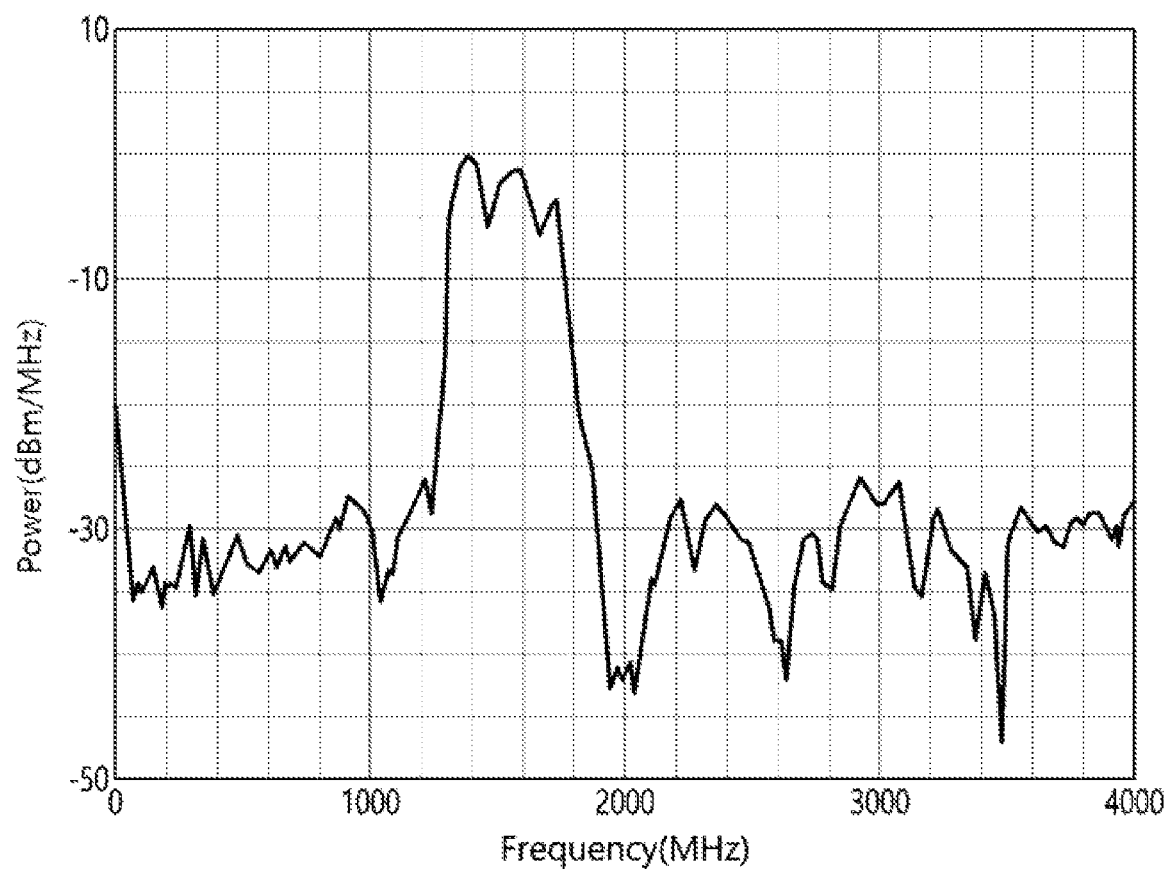
Figure 4C:
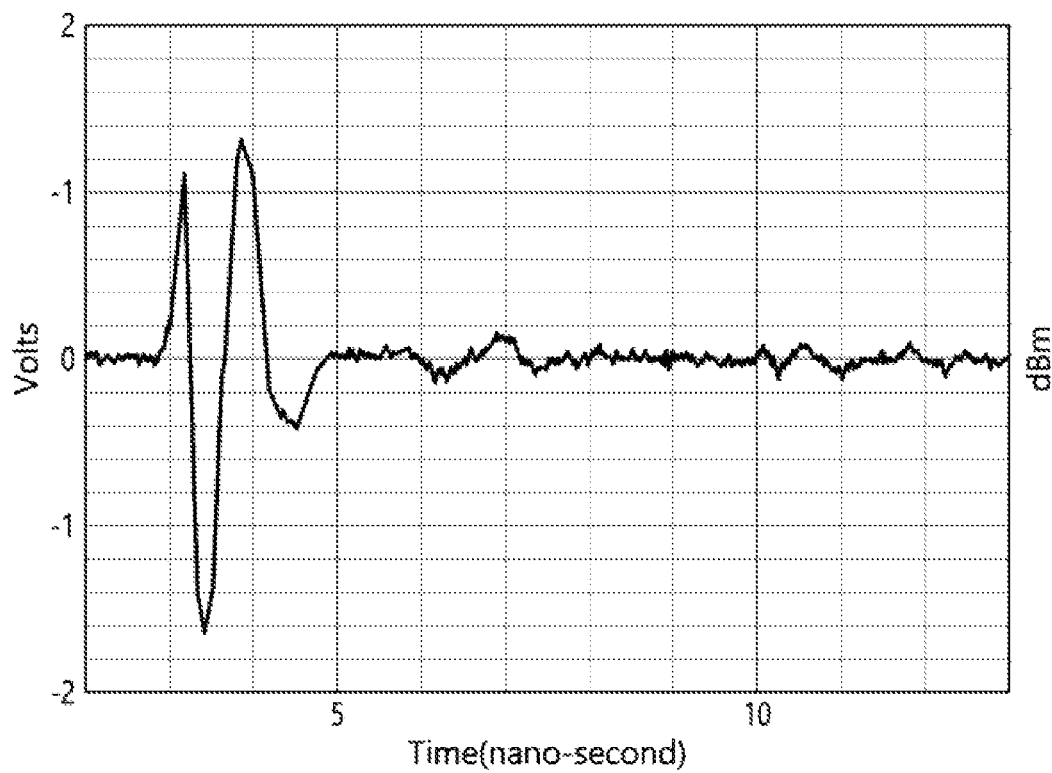
Figure 4D:
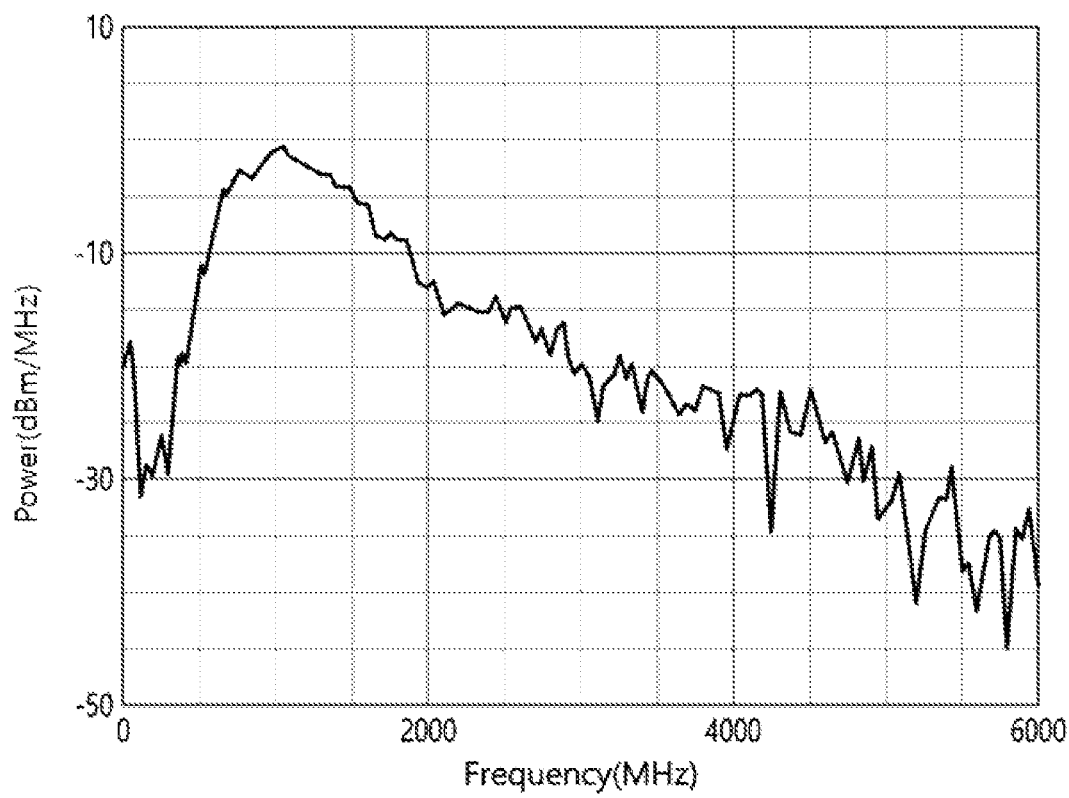
Figure 5:
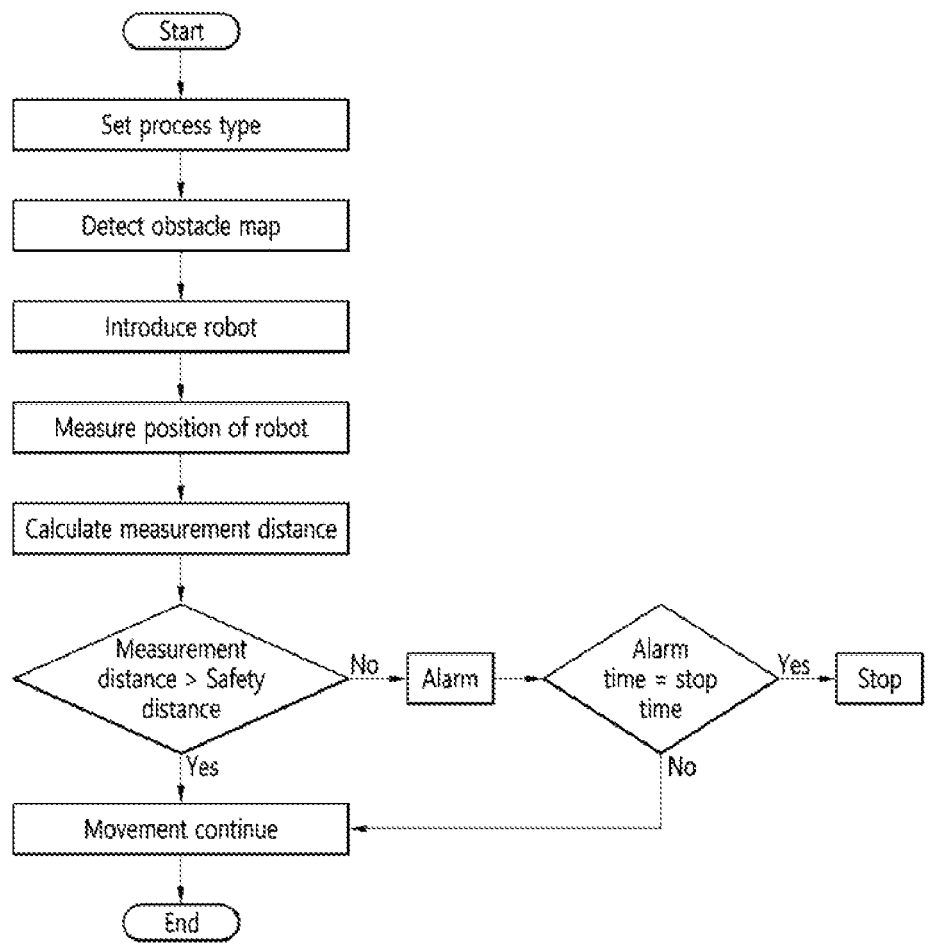
FIG. 5 is a flowchart illustrating a robot detection and control method within a chamber according to the present invention.

A waveform received from the UWB radar 100 exhibits different characteristics depending on the structure, as illustrated in FIGS. 4A to 4D.

These characteristics mainly vary depending on a dielectric constant of the structure, the chamber is mainly made of stainless steel or aluminum, and the hand of the robot is made of a ceramic material. The characteristics of the received waveform are divided according to the characteristics of these materials.

On the other hand, a robot 600 introduced into the chamber 500 is provided with a detection dielectric 650 having a different dielectric constant from the structure in the chamber. The detection dielectric 650 may be installed below the robot 600 or inserted into the robot 600. In addition, the size of the detection dielectric 650 is preferably provided in a small size within a range that can be easily detected by the UWB radar 100.

When the robot 600 is introduced into the chamber, the UWB radar 100 measures a distance from the detection dielectric 650. At this time, when the UWB radar 100 is one or two, the distance of the detection dielectric 650 is detected, but a direction is not accurately specified, so that it is difficult to determine the exact position of the detection dielectric 650.

In the embodiment, three UWB radars 100 are arranged to accurately detect the position of the detection dielectric 650.

Specifically, the position detection unit 200 draws a virtual circle centered on the UWB radar 100 by using the distance of the detection dielectric 650 detected by the UWB radar 100 as a radius. In the embodiment, three UWB radars 100 are arranged to draw a total of three virtual circles.

In addition, the position detection unit 200 detects the positions of intersections A, B, and C where the virtual circles intersect, and calculates the number of circles intersecting at each intersection. Then, in FIG. 3, the intersection A is 2, the intersection B is 3, and the intersection C is 2, and the position detection unit 200 determines B, which is the maximum intersection, as a coordinate of the robot.

The storage unit 400 stores reception waveforms for the structure in the chamber such as a wall or a lift pin, and also stores reception waveforms of a wafer or the detection dielectric 650. Since the dielectric constant of the detection dielectric 650 is significantly different from those of other structures, the detection dielectric 650 has a significant difference in the reception waveform, so that the position detection unit 200 may easily identify the detection dielectric 650 by using stored data. For example, the detection dielectric 650 may be constituted by one of silver, gold, and platinum.

Meanwhile, the storage unit 400 stores an obstacle map shaping a structure that the robot 600 should not contact in the chamber. A position coordinate of the structure such as a wall, a lift pin, and a chuck may be stored in the obstacle map.

In addition, an intrinsic safety distance may be set and stored in the obstacle map according to a type of obstacle. The safety distance is a minimum distance that a distance between the corresponding obstacle and the robot needs to be maintained, and the safety distance may vary depending on the type of obstacle.

For example, the safety distance of the lift pin may be set to be smaller than the safety distance of the wall, and the movement path of the robot is set to a path over the safety distance.

The obstacle and the safety distance by the obstacle map are not always fixed. For example, depending on the type of process, the obstacle may be a non-obstacle and the non-obstacle may be an obstacle, and the safety distance of the chuck may vary during a baking process and a replacement of a ring kit.

In addition, the safety distance of the obstacle may be changed depending on whether the wafer is measured by the UWB radar. That is, when the wafer is measured by the UWB radar, it is determined that the robot 600 is transferring the wafer, so that the safety distance may be changed. The robot control unit 300 may control the movement of the robot of the substrate processing apparatus in which the robot detection and control system is implemented. The robot control unit 300 calculates a measurement distance between two coordinates of the robot and the obstacle by using the coordinate of the robot detected by the position detection unit and the coordinate of the obstacle from the obstacle map stored in the storage unit. The measurement distance may be calculated by a general Euclidean distance calculation method, and the robot control unit compares the calculated measurement distance with the safety distance of the corresponding obstacle stored in the obstacle map and determines the state as normal if the measurement distance is greater than the safety distance, and then continues to the operation. On the contrary, if the measurement distance is smaller than or equal to the safety distance, it is determined as abnormal and an alarm is operated. In addition, when the time determined as abnormal is longer than a predetermined time, an interlock signal is sent to stop the operation of the robot.

At this time, the robot control unit 300 obtains the coordinate of the robot by the position detection unit 200, calculates the measurement distance between the coordinate of each obstacle and the coordinate of the robot to extract the shortest distance obstacle with the smallest measurement distance, and determines whether the measurement distance between the coordinate of the robot and the shortest distance obstacle is greater than or equal to the safety distance.

Meanwhile, in the chamber process, the robot 600 often performs repetitive operations. In this case, when an error due to a motor or the like is accumulated, there is a problem that the robot gradually deviates from the set path.

The robot control unit 300 according to the present embodiment calculates a measurement distance between the coordinate of the obstacle in the chamber and the coordinate of the robot in the same repeated operation and compares the calculated measurement distance with the measurement distance of the previous operation.

The positions of the robot by the position detection unit 200 are all stored and accumulated in the storage unit in real time, and the movement of the robot of the previous operation can be searched.

The robot control unit detects a movement history of the robot and compares the detected movement history with the current movement to compensate the movement of the robot when it is determined that an error tolerance range is deviated from the set path.

For example, as a result of detecting the movement history of the robot, when the position of the robot is determined to be gradually biased in an x direction and the measurement position of the current robot is 2.3 out of the error tolerance range 2, the robot control unit may compensate and control the movement of the robot by 2.3 in the x direction.

The robot control unit may control the robot by comparing the measurement coordinate of the current robot with a set path separately from the obstacle.

That is, the robot control unit calculates the measurement distance using a set coordinate, which is a preset path, and the measurement coordinate of the robot measured by the UWB radar, and generates an alarm or stops the movement of the robot when the measurement distance is greater than or equal to a critical range. When the measurement distance is significantly out of the critical range, it is preferred to stop the robot by generating an interlock signal.

In the robot detection and control system within the chamber according to the present invention, it is possible to generate an optimal movement path of the robot by accumulating data on the movement of the robot in the chamber.

That is, an optimal movement path of the shortest distance is generated while a position where frequent accidents occur is avoided and the safety distance for each obstacle may be deviated as much as possible. The optimal movement path may be generated through machine learning using accumulated data.

Next, a robot detection and control method within a chamber according to the present invention will be described.

First, when a process type is input, an obstacle map corresponding to the process type is detected in a storage unit. At this time, the obstacle map stores an obstacle type and a safety distance of the obstacle.

When a robot is introduced into the chamber, the position of the robot is measured by a UWB radar disposed in the chamber. The UWB radar is preferably disposed below the chamber, and at least three UWB radars are preferably disposed.

A position detection unit detects a coordinate of the robot using data transmitted from the UWB radar, and a robot control unit calculates a measurement distance using the detected coordinate of the robot and the coordinate of the obstacle.

In addition, after the calculated measurement distance is compared with the safety distance of each obstacle, the robot continues to move when the measurement distance is greater than the safety distance, and on the contrary, an alarm is generated when the measurement distance is smaller than or equal to the safety distance. At this time, both the alarm occurrence and the position of the robot where the alarm has occurred are all stored in the storage unit.

When the alarm generation time is short and the measurement distance becomes larger than the safety distance again, the robot continues to move, and when the alarm generation time reaches a stop time, the robot control unit stops the movement of the robot.

Although the robot has been described in the embodiment, the present invention is applicable to a moving object in the chamber.

As described above, the present invention has been described with reference to the exemplary embodiments. However, it will be appreciated by those skilled in the art that various modifications and changes of the present invention can be made without departing from the spirit and the scope of the present invention which are disclosed in the appended claims.

EXPLANATION OF REFERENCE NUMERALS AND SYMBOLS

| | |
|---|---|
| 100: UWB radar | 200: Position detection unit |
| 300: Robot control unit | 400: Storage unit |
| 500: Chamber | 600: Robot |
| 650: Detection dielectric | |

The invention claimed is:

1. A robot detection and control system within a chamber comprising:
   a UWB radar provided in the chamber;
   a position detection unit configured to detect a position of a robot moving in the chamber using data by the UWB radar; and
   a robot control unit configured to compare the position of the robot with a position of an obstacle to control the movement of the robot.

2. The robot detection and control system of claim 1, wherein the robot control unit is configured to calculate a measurement distance between a coordinate of the robot and a coordinate of the obstacle, and compare the measurement distance with a safety distance.

3. The robot detection and control system of claim 2, wherein a separate safety distance for each of at least one obstacle is set and stored in a storage unit, and
   the robot control unit is configured to extract a shortest distance obstacle from the coordinate of the robot to determine whether the measurement distance between the coordinate of the robot and a coordinate of the shortest distance obstacle is greater than or equal to the detected safety distance.

4. The robot detection and control system of claim 2, wherein the robot control unit is configured to calculate a measurement distance between the coordinate of the obstacle and the coordinate of the robot in repeated operations, with each repetition including a comparison of the measurement distance with a measurement distance of the previous operation to compensate the movement of the robot.

5. The robot detection and control system of claim 1, wherein the UWB radar includes three UWB radars, and
   the position detection unit is configured to form a virtual circle having a distance from the robot detected by each of the three UWB radar as a radius, and set a maximum intersection of the circle as the coordinate of the robot.

6. The robot detection and control system of claim 5, wherein the robot is provided with a detection dielectric having a different dielectric constant from other obstacles.

7. The robot detection and control system of claim 1, wherein the robot control unit is configured to convert a structure into one of a determined obstacle and a determined non-obstacle based on an obstacle map according to an operation content.

8. A substrate processing apparatus comprising:
   a chamber;
   a robot introduced into the chamber;
   a ultra wide band (UWB) radar provided in the chamber;
   a position detection unit configured to detect a position of the robot moving in the chamber using data measured by the UWB radar; and
   a storage unit which stores a coordinate of the robot detected by the position detection unit.

9. The substrate processing apparatus of claim 8, further comprising:
   a robot control unit configured to control the movement of the robot,
   wherein the storage unit further stores a coordinate of an obstacle in the chamber.

10. The substrate processing apparatus of claim 9, wherein the robot control unit is configured to calculate a measurement distance between the coordinate of the robot and the coordinate of the obstacle and compare the measurement distance with a safety distance.

11. The substrate processing apparatus of claim 10, wherein the storage unit further stores the safety distance for the obstacle, and
    the robot control unit is configured to extract a shortest distance obstacle from the coordinate of the robot to determine whether the measurement distance between the coordinate of the robot and a coordinate of the shortest distance obstacle is greater than or equal to the safety distance.

12. The substrate processing apparatus of claim 10, wherein the UWB radar includes three UWB radars, and
    the position detection unit is configured to form a virtual circle having a distance from the robot detected by each of the three UWB radars as a radius, and set a maximum intersection of the virtual circle as the coordinate of the robot.

13. The substrate processing apparatus of claim 9, wherein the robot includes a detection dielectric having a different dielectric constant from the obstacle.

14. The substrate processing apparatus of claim 9, wherein the robot control unit is configured to calculate a measurement distance between the coordinate of the obstacle and the coordinate of the robot in repeated operations, with each repetition including a comparison of the measurement distance with a measurement distance of a previous operation to compensate the movement of the robot.

15. The substrate processing apparatus of claim 9, wherein the robot control unit is configured to convert a structure into one of determined obstacle and aaa determined non-obstacle based on an obstacle map according to an operation content.

16. A robot detection and control method within a chamber comprising:
    measuring, by a position detection unit, a position of a robot moving in a chamber by using a UWB radar provided in the chamber; and
    comparing, by a robot control unit, the position of the robot with a position of an obstacle to control the movement of the robot.

17. The robot detection and control method of claim 16, wherein the UWB radar includes three UWB radars, and
    wherein the measuring of the position of the robot includes;
    measuring, by each of the three UWB radars, a distance from a detection dielectric of the robot;
    forming for each of the three UWB radars, by the position detection unit, a virtual circle having the distance from the detection dielectric of the robot as a radius; and
    setting, by the position detection unit, an intersection of the virtual circle for the three UWB Radars as a coordinate of the robot.

18. The robot detection and control method of claim 16, wherein the robot control unit receives the coordinate of the robot from the position detection unit in real time and stores the received coordinate of the robot in the storage unit, and compares the real-time coordinate of the robot with a set coordinate stored in the storage unit and generates an alarm when the real-time coordinate of the robot is out of a critical range.

* * * * *